United States Patent
Kanayama et al.

(10) Patent No.: US 8,854,090 B2
(45) Date of Patent: Oct. 7, 2014

(54) DRIVER CIRCUIT AND SEMICONDUCTOR DEVICE

(71) Applicant: Fujitsu Limited, Kawasaki (JP)

(72) Inventors: Yasutaka Kanayama, Inagi (JP); Noriyuki Tokuhiro, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 46 days.

(21) Appl. No.: 13/726,200

(22) Filed: Dec. 23, 2012

(65) Prior Publication Data

US 2013/0257490 A1  Oct. 3, 2013

(30) Foreign Application Priority Data

Mar. 27, 2012  (JP) ................... 2012-071380

(51) Int. Cl.
| | | |
|---|---|---|
| H03K 3/00 | (2006.01) | |
| H03K 19/00 | (2006.01) | |
| H03K 19/0185 | (2006.01) | |
| H03K 3/356 | (2006.01) | |

(52) U.S. Cl.
CPC ...... *H03K 3/356113* (2013.01); *H03K 19/0005* (2013.01); *H03K 19/018585* (2013.01); *H03K 19/018571* (2013.01)
USPC .......................................... 327/112; 327/108

(58) Field of Classification Search
USPC ................................................. 327/108, 112
See application file for complete search history.

(56) References Cited

U.S. PATENT DOCUMENTS

| | | | |
|---|---|---|---|
| 7,154,981 B2 | 12/2006 | Tokuhiro et al. | |
| 7,193,431 B2 | 3/2007 | Miyake et al. | |
| 7,362,127 B2 | 4/2008 | Tokuhiro et al. | |
| 7,808,270 B2 * | 10/2010 | Fujisawa ....................... 326/30 |
| 2006/0022701 A1 | 2/2006 | Tokuhiro et al. | |
| 2006/0022713 A1 | 2/2006 | Tokuhiro et al. | |
| 2006/0044008 A1 | 3/2006 | Miyake et al. | |
| 2006/0087339 A1 | 4/2006 | Chung et al. | |
| 2010/0188102 A1 | 7/2010 | Kaiwa et al. | |
| 2011/0193590 A1 | 8/2011 | Nakagawa et al. | |

FOREIGN PATENT DOCUMENTS

| | | |
|---|---|---|
| EP | 1653372 A2 | 5/2006 |
| JP | 2006-042136 | 2/2006 |
| JP | 2006-042137 | 2/2006 |
| JP | 2006-066833 | 3/2006 |

OTHER PUBLICATIONS

EESR of EPC Patent Application 12197748.2 dated Jan. 7, 2014.

* cited by examiner

*Primary Examiner* — Hai L Nguyen
(74) *Attorney, Agent, or Firm* — Fujitsu Patent Center

(57) ABSTRACT

A PMOS output stage and an NMOS output stage of which output impedances are controlled in accordance with impedance codes, a gate control part which drives output transistors held by the PMOS output stage and the NMOS output stage, and a slew rate control part which generates bias voltages to control driving ability of the gate control part based on an input current are included, and manufacturing variability of an input current circuit generating an input current is corrected by using the impedance code by the slew rate control part.

8 Claims, 7 Drawing Sheets

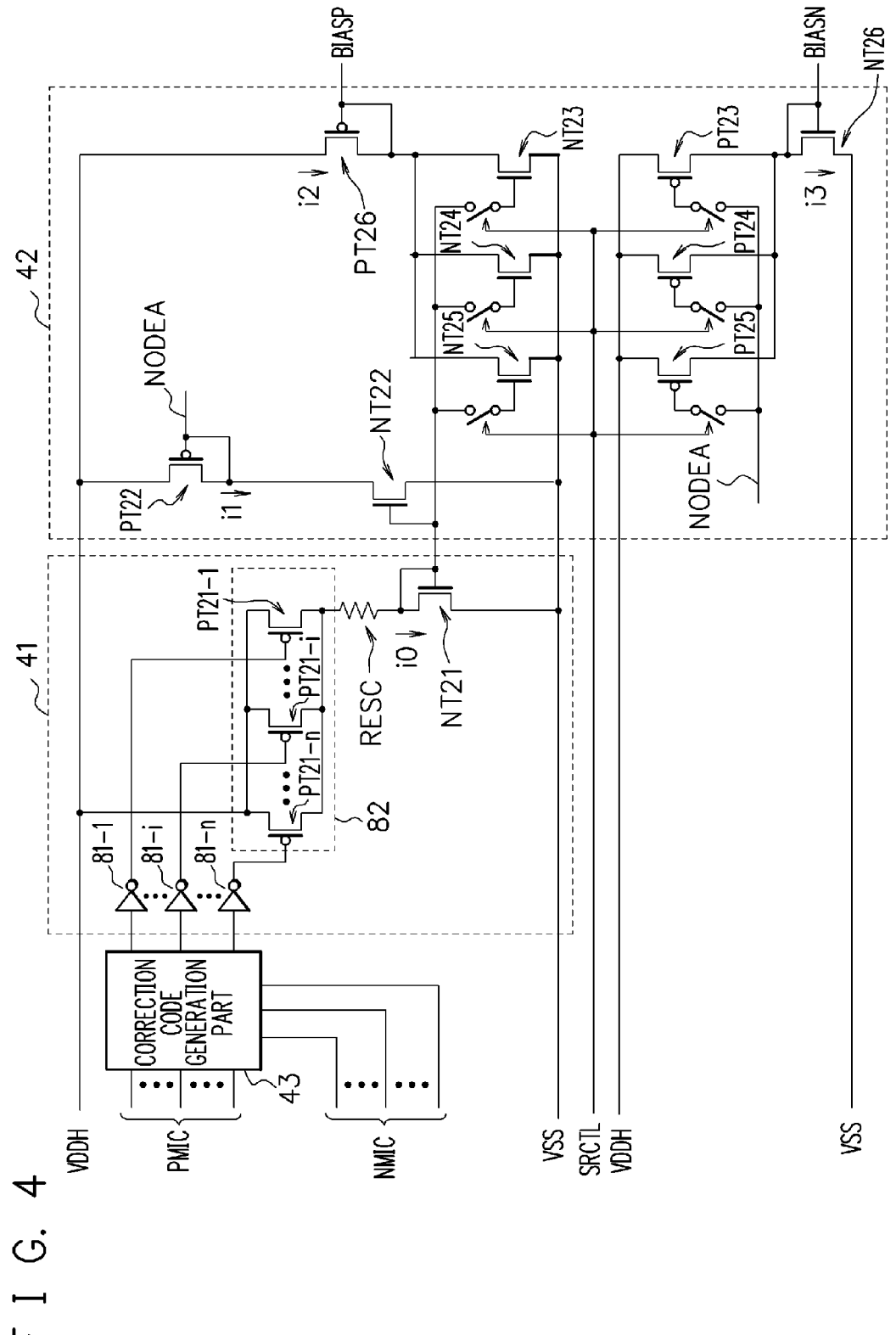
F I G. 4

F I G. 7
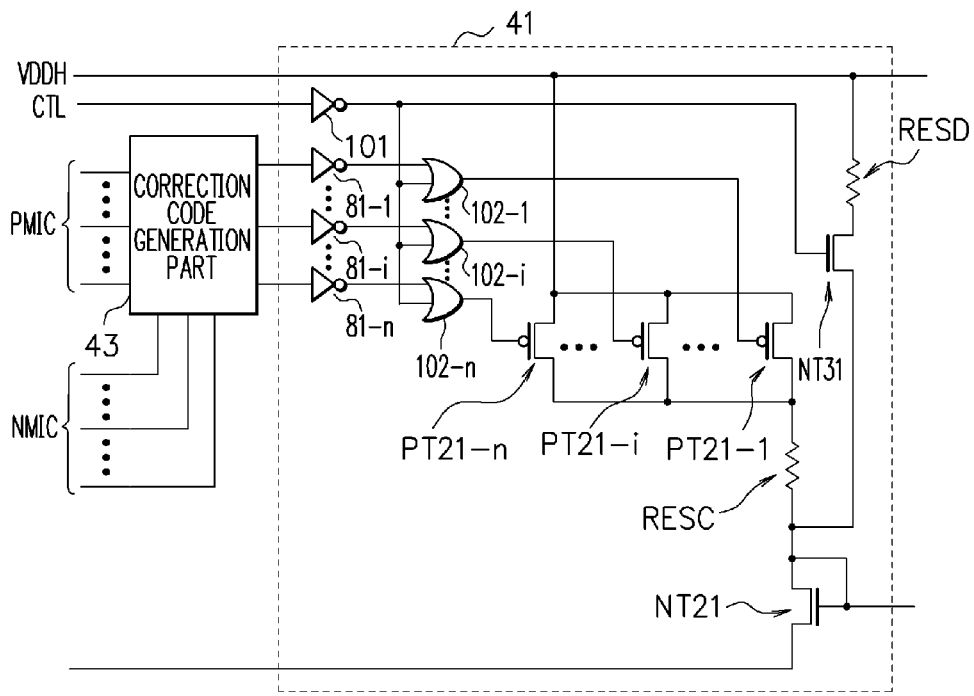
F I G. 8
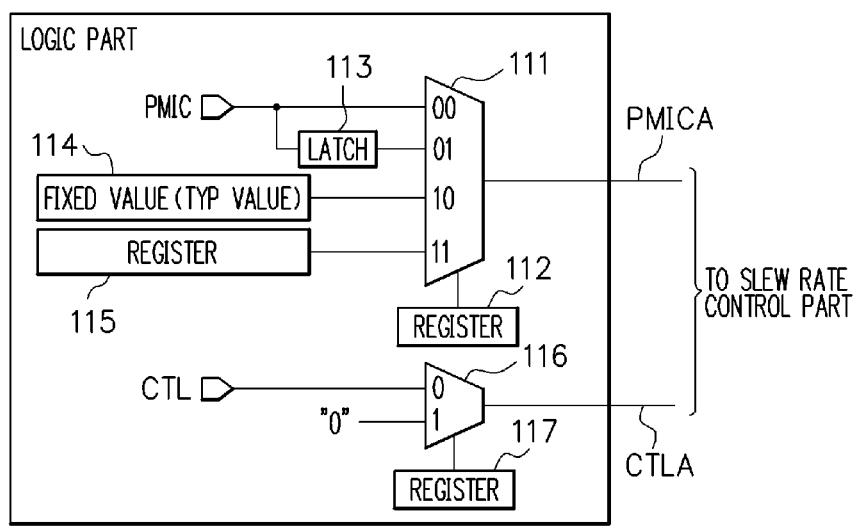

US 8,854,090 B2

DRIVER CIRCUIT AND SEMICONDUCTOR DEVICE

CROSS-REFERENCE TO RELATED APPLICATION

This application is based upon and claims the benefit of priority of the prior Japanese Patent Application No. 2012-071380, filed on Mar. 27, 2012, the entire contents of which are incorporated herein by reference.

FIELD

The embodiments discussed herein are directed to a driver circuit, and a semiconductor device including the driver circuit.

BACKGROUND

The driver circuit is a circuit of which basic operations are to output signals at high-level or low-level in accordance with inputs. In a recent driver circuit, an output impedance (DC characteristics) is defined and an output slew rate (AC characteristics) is defined.

FIG. 9 is a view illustrating a configuration of a driver circuit. A driver circuit 210 includes a PMOS output stage 220P, an NMOS output stage 220N, pre-buffer groups 230P, 230N driving the PMOS output stage 220P and the NMOS output stage 220N, and a slew rate control part (current source circuit) 240. Besides, an input signal IN, an impedance code PMIC for PMOS and an impedance code NMIC for NMOS to control the output impedance, and a slew rate control signal SRCTL to control the output slew rate are supplied to the driver circuit 210 from a logic part 250. Besides, the other control signals SIG are supplied from the logic part 250 to the driver circuit 210. Note that the impedance codes PMIC, NMIC are generated by an impedance code generation part 260 having the same configuration as the output stages 220P, 220N.

The PMOS output stage 220P includes plural P-channel type transistors as output transistors. In each of the P-channel type transistors, a source is connected to a power supply line of a voltage VDDH, a drain is connected to an output terminal of an output signal OUT via a resistor ROP. Besides, the NMOS output stage 220N includes plural N-channel type transistors as the output transistors. In each of the N-channel type transistors, a source is connected to a power supply line of a reference potential VSS, a drain is connected to the output terminal of the output signal OUT via a resistor RON. When high-level is output, a gate voltage of the output transistor of the PMOS output stage 220P is set at a voltage VSS to set in ON state, and a gate voltage of the output transistor of the NMOS output stage 220N is set at the voltage VSS to set in OFF state. When low-level is output, the gate voltage of the output transistor of the PMOS output stage 220P is set at the voltage VDDH to set in OFF state, and the gate voltage of the output transistor of the NMOS output stage 220N is set at the voltage VDDH to set in ON state.

The output transistors of the PMOS output stage 220P are controlled by pre-buffers 230P-1, 230P-2, ..., 230P-n provided to correspond to each of them. The output transistors of the NMOS output stage 220N are controlled by pre-buffers 230N-1, 230N-2, ..., 230N-n provided to correspond to each of them.

The respective pre-buffers 230P-i, 230N-i ("i"=a natural number of one to "n") include ON/OFF control parts 231P, 231N objected to adjust the output impedance, and gate driving parts 232P, 232N objected to adjust the output slew rate. The ON/OFF control parts 231P, 231N adjust the number of output transistors of which ON/OFF control is to be performed in accordance with the input signal IN at the PMOS output stage 220P and the NMOS output stage 220N based on the impedance codes PMIC, NMIC to adjust the output impedance. Driving abilities of the gate driving parts 232P, 232N are controlled by bias voltages BIASP, BIASN supplied from the slew rate control part 240, and the gate driving parts 232P, 232N drive the output transistors of the PMOS output stage 220P and the NMOS output stage 220N.

The slew rate control part 240 includes an internal constant-current source 241 and a bias voltage generation part 242. The slew rate control part 240 generates and outputs the bias voltages BIASP, BIASN in accordance with the slew rate control signal SRCTL. The internal constant-current source 241 includes a resistor R201 and an N-channel type transistor NT201 connected between a power supply line of the voltage VDDH and a power supply line of the reference potential VSS, and generates an input current. A gate voltage CMI for the N-channel type transistor in accordance with the input current is supplied to the bias voltage generation part 242. The bias voltage generation part 242 includes an N-channel type transistor which is current-mirror connected to the N-channel type transistor NT201 of the internal constant-current source 241. The bias voltage generation part 242 performs a current-voltage conversion of an output current in accordance with the input current obtained by changing a current-mirror ratio in accordance with the slew rate control signal SRCTL, and generates and outputs the bias voltages BIASP, BIASN.

An art is proposed in which plural transistors are connected in parallel, and a desired resistance value is enabled by turning ON/OFF the transistors by means of a digital control (for example, refer to Patent Documents 1, 2). In Patent Document 1, it is described in which a level detection by using a reference resistance is performed, and a resistance value equivalent to the reference resistance is generated by the plural transistors connected in parallel. Besides, a driver circuit is proposed in which driving ability is made adjustable by selecting and driving plural driving transistors connected in parallel in accordance with a control signal (for example, refer to Patent Document 3).

[Patent Document 1] Japanese Laid-open Patent Publication No. 2006-66833
[Patent Document 2] Japanese Laid-open Patent Publication No. 2006-42136
[Patent Document 3] Japanese Laid-open Patent Publication No. 2006-42137

In the driver circuit 210 illustrated in FIG. 9, the output slew rate is controlled by the bias voltages BIASP, BIASN in accordance with the slew rate control signal SRCTL supplied to the gate driving parts 232P, 232N of the pre-buffers 230P-i, 230N-i. However, there is a case when a desired slew rate is not obtained caused by variations of the bias voltages BIASP, BIASN resulting from manufacturing variability of the slew rate control part 240, in particular, the internal constant-current source 241. Besides, there is also a case when the desired slew rate is not obtained caused by manufacturing variability of the gate driving parts 232P, 232N held by the pre-buffers 203P-i, 230N-i.

SUMMARY

According to an aspect of a driver circuit, a first output part in which plural first conductive transistors are connected in parallel, and an output impedance is controlled in accordance with first control information; a second output part in which plural second conductive transistors are connected in parallel, and an output impedance is controlled in accordance with second control information; a gate control part which drives the plural first conductive transistors held by the first output part and the plural second conductive transistors held by the second output part; and a current source circuit which generates a signal controlling driving ability of the gate control part are included. The current source circuit includes: plural first conductive transistors corresponding to the plural first conductive transistors held by the first output part and ON/OFF controlled based on the first control information; a first resistor in which drains of the plural first conductive transistors are commonly connected to one end thereof; and a signal generation part which receives a current flowing at the plural first conductive transistors and the first resistor as an input current, and generates a signal controlling the driving ability of the gate control part based on the input current.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 4 is a view illustrating a configuration example of a slew rate control part in the present embodiment;

FIG. 7 is a view illustrating a configuration example of a semiconductor device according to a second embodiment;

FIG. 8 is a view illustrating a configuration example of a semiconductor device according to a third embodiment.

DESCRIPTION OF EMBODIMENTS

Preferred embodiments will be explained with reference to accompanying drawings.

(First Embodiment)

A first embodiment is described.

Figure 1:
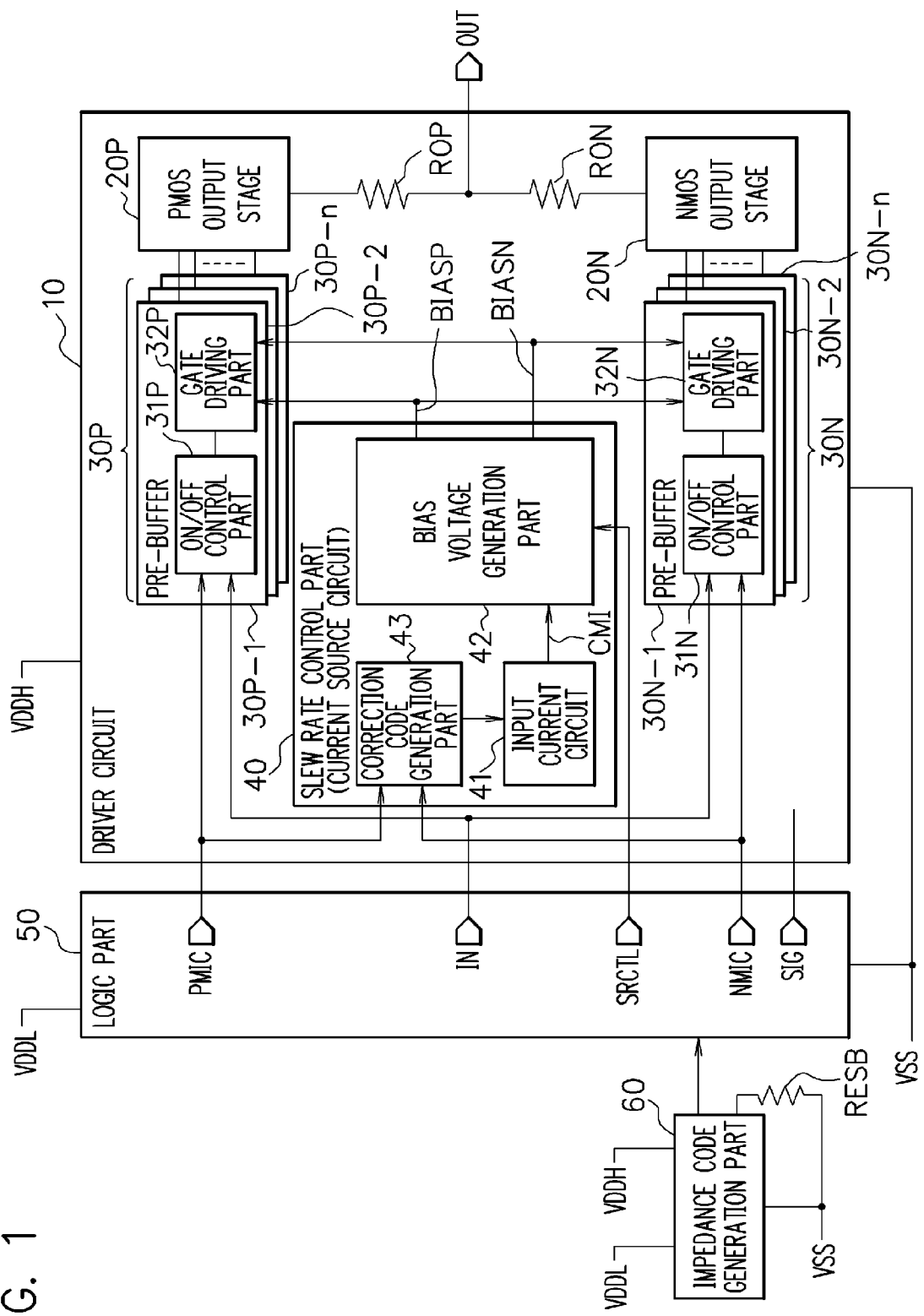
FIG. 1 is a view illustrating a configuration example of a semiconductor device in a first embodiment.

FIG. 1 is a view illustrating a configuration example of a semiconductor device according to the first embodiment. The semiconductor device includes a driver circuit 10, a logic part 50, and an impedance code generation part 60.

The driver circuit 10 includes a PMOS output stage 20P, an NMOS output stage 20N, pre-buffer groups 30P, 30N, and a slew rate control part (current source circuit) 40. Besides, an input signal IN, an impedance code PMIC for PMOS, an impedance code NMIC for NMOS, a slew rate control signal SRCTL, and the other control signals SIG are supplied to the driver circuit 10 from the logic part 50. The impedance codes PMIC, NMIC are to control output impedance. The slew rate control signal SRCTL is to control an output slew rate (slopes of rising and falling of a signal). The impedance codes PMIC, NMIC are generated by an impedance code generation part 60 having the same configuration as the output stages 20P, 20N. The impedance code generation part 60 performs a comparison operation using an external reference resistor RESB, judges the number of transistors to be turned on when the impedance becomes a desired value, and generates the impedance code.

Figure 2:
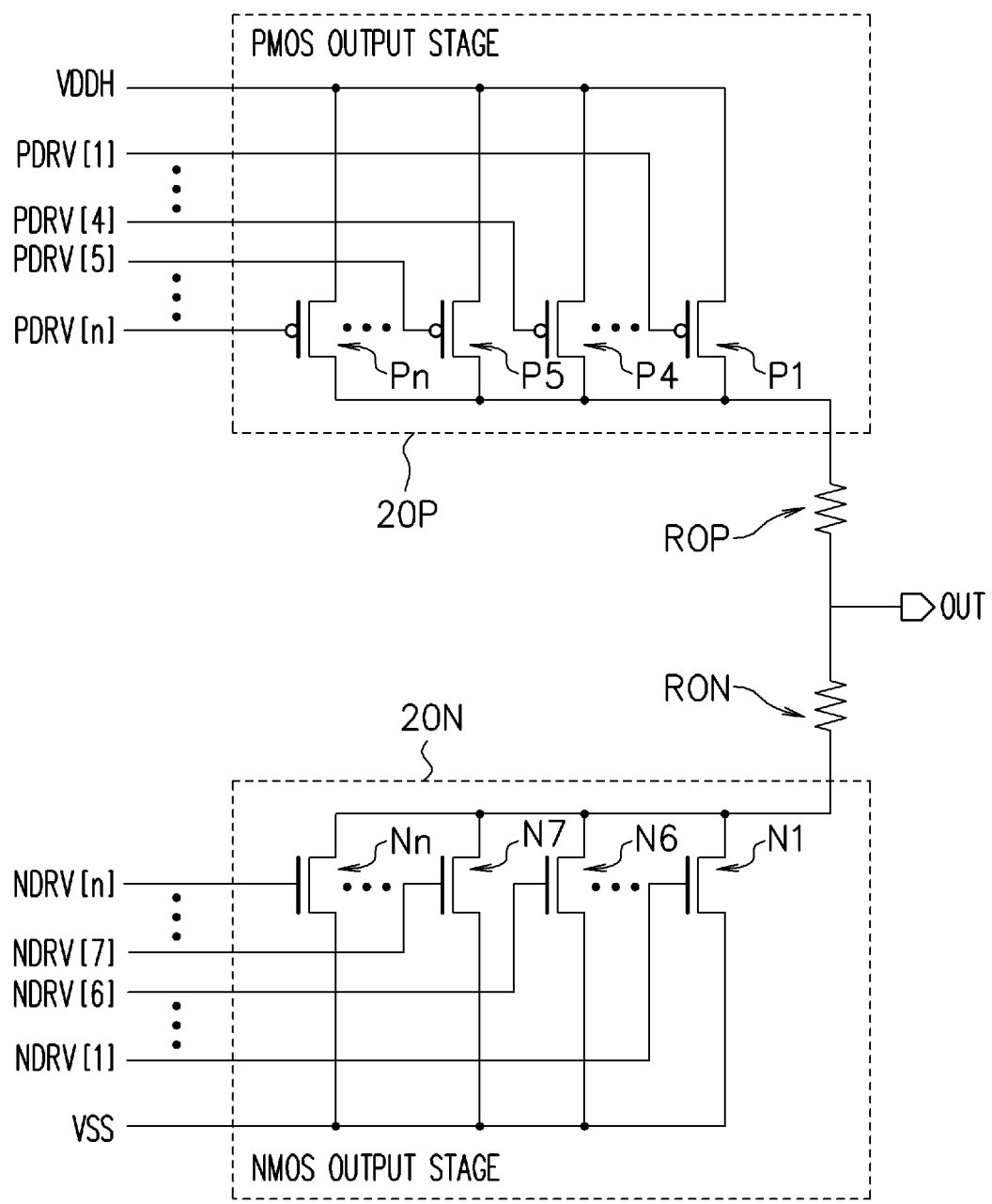
FIG. 2 is a view illustrating a configuration example of a PMOS output stage and an NMOS output stage in the present embodiment.

A configuration example of the PMOS output stage 20P and the NMOS output stage 20N is illustrated in FIG. 2. The PMOS output stage 20P includes plural P-channel type transistors (hereinafter, P-type transistors) P1 to Pn as output transistors. The NMOS output stage 20N includes plural N-channel type transistors (hereinafter, N-type transistors) N1 to Nn as output transistors. In each of the P-type transistors P1 to Pn held by the PMOS output stage 20P, a source is connected to a power supply line of a voltage VDDH, and a drain is connected to an output terminal of an output signal OUT via a resistor ROP. In each of the N-type transistors N1 to Nn held by the NMOS output stage 20N, a source is connected to a power supply line of a reference potential VSS, and a drain is connected to the output terminal of the output signal OUT via a resistor RON.

A drive signal PDRV[i] from the pre-buffer group 30P is supplied to a gate of the P-type transistor Pi ("i" is a natural number from one to "n", it is also the same in the following) held by the PMOS output stage 20P. A drive signal NDRV[i] from the pre-buffer group 30N is supplied to a gate of the N-type transistor Ni held by the NMOS output stage 20N.

When a high-level output signal OUT is output from the driver circuit 10, the drive signal PDRV[i] corresponding to the P-type transistor Pi which is enabled in accordance with the impedance code PMIC is set at a voltage VSS, and the drive signal NDRV[i] is set at the voltage VSS. Note that the drive signal PDRV[i] which is not set at the voltage VSS is at the voltage VDDH. When a low-level output signal OUT is output from the driver circuit 10, the drive signal PDRV[i] is set at the voltage VDDH, and the drive signal NDRV[i] corresponding to the N-type transistor Ni which is enabled in accordance with the impedance code NMIC is set at the voltage VDDH. Note that the drive signal NDRV[i] which is not set at the voltage VDDH is at the voltage VSS.

For example, it is assumed that the P-type transistors P1 to P4 and the N-type transistors N1 to N6 are enabled, and the P-type transistors P5 to Pn and the N-type transistors N7 to Nn are disabled in accordance with the impedance codes PMIC, NMIC. At this time, the drive signal PDRV[5] to the drive signal PDRV[n] are constantly set at the voltage VDDH regardless of the input signal IN, and the drive signal NDRV[7] to the drive signal NDRV[n] are constantly set at the voltage VSS regardless of the input signal IN. The P-type transistors P5 to Pn and the N-type transistors N7 to Nn are thereby constantly turned into OFF states. On the other hand, switching between the voltage VDDH and the voltage VSS is performed in accordance with the input signal IN as for the drive signal PDRV[1] to the drive signal PDRV[4] and the drive signal NDRV[1] to the drive signal NDRV[6]. The P-type transistors P1 to P4 and the N-type transistors N1 to N6 are thereby ON/OFF controlled in accordance with the input signal IN. The number of P-type transistors Pi and N-type transistors Ni which is to be ON/OFF controlled in accordance with the input signal IN is adjusted as stated above to adjust the output impedance.

Next, the pre-buffer groups 30P, 30N are described. The pre-buffer group 30P is to drive the PMOS output stage 20P, and includes pre-buffers 30P-i provided corresponding to the P-type transistors Pi held by the PMOS output stage 20P. The pre-buffer group 30N is to drive the NMOS output stage 20N, and includes pre-buffers 30N-i provided corresponding to the N-type transistors Ni held by the NMOS output stage 20N.

The respective pre-buffers 30P-i, 30N-i include ON/OFF control parts 31P, 31N objected to adjust the output impedance and gate driving parts 32P, 32N objected to adjust the output slew rate. The ON/OFF control parts 31P, 31N control the number of P-type transistors Pi and N-type transistors Ni which is to be ON/OFF controlled in accordance with the input signal IN at the PMOS output stage 20P and the NMOS output stage 20N based on the impedance codes PMIC, NMIC. In each of the gate driving parts 32P, 32N, driving ability is controlled by bias voltages BIASP, BIASN supplied from the slew rate control part 40, and the gate driving parts 32P, 32N drive the P-type transistors Pi of the PMOS output stage 20P and the N-type transistors Ni of the NMOS output stage 20N.

Figure 3A:
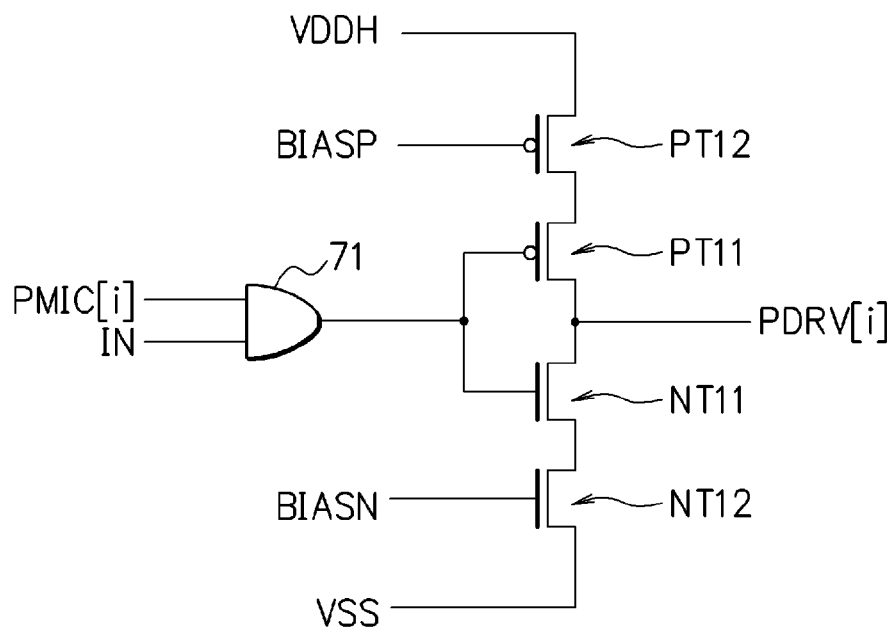
FIG. 3A and FIG. 3B are views illustrating configuration examples of pre-buffers in the present embodiment.

FIG. 3A is a view illustrating a configuration example of the pre-buffer 30P-i. The pre-buffer 30P-i includes a logical product operation circuit (AND circuit) 71, P-type transistors PT11, PT12, and N-type transistors NT11, NT12. The AND circuit 71 corresponds to the ON/OFF control part 31P, and a circuit made up of the P-type transistors PT11, PT12 and the N-type transistors NT11, NT12 corresponds to the gate driving part 32P.

The impedance code PMIC[i] and the input signal IN are input to the AND circuit 71, and the AND circuit 71 performs a logical product operation thereof and outputs an operation result. In each of the P-type transistor PT11 and the N-type transistor NT11, a gate is connected to an output terminal of the AND circuit 71, and a drain is connected to a signal line of the drive signal PDRV[i]. A source of the P-type transistor PT11 is connected to the power supply line of the voltage VDDH via the P-type transistor PT12 in which the bias voltage BIASP is supplied to a gate thereof. A source of the N-type transistor NT11 is connected to the power supply line of the voltage VSS via the N-type transistor NT12 in which the bias voltage BIASN is supplied to a gate thereof.

In the pre-buffer 30P-i constituted as stated above, the P-type transistor PT11 is in OFF state and the N-type transistor NT11 is in ON state when the impedance code PMIC[i] is "1" (enable) and the input signal IN is "1" (high-level). Accordingly, the drive signal PDRV[i] is set at the voltage VSS, and the corresponding P-type transistor Pi of the PMOS output stage 20P is in ON state. Besides, the P-type transistor PT11 is in ON state and the N-type transistor NT11 is in OFF state when the impedance code PMIC[i] is "1" and the input signal IN is "0" (zero) (low-level). Accordingly, the drive signal PDRV[i] is set at the voltage VDDH and the corresponding P-type transistor Pi of the PMOS output stage 20P is in OFF state. When the input signal IN changes from "1" to "0" (zero) or from "0" (zero) to "1" under the state in which the impedance code PMIC[i] is "1", driving ability of an inverter made up of the P-type transistor PT11 and the N-type transistor NT11 is controlled by the P-type transistor PT12 and the N-type transistor NT12 in which the bias voltages BIASP, BIASN are supplied to gates thereof. The slew rate is controlled by controlling a current amount charging and discharging the signal line of the drive signal PDRV[i] as stated above.

Besides, when the impedance code PMIC[i] is "0" (disable), the P-type transistor PT11 is in ON state and the N-type transistor NT11 is in OFF state regardless of the input signal IN. Accordingly, the drive signal PDRV[i] is set at the voltage VDDH, and the corresponding P-type transistor Pi of the PMOS output stage 20P is constantly in OFF state.

Figure 3B:
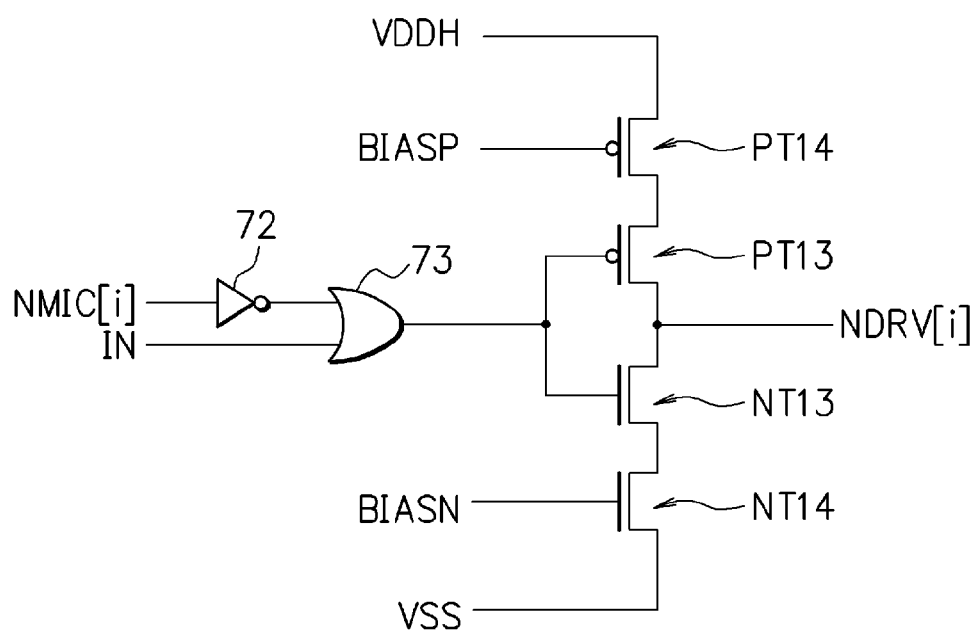

FIG. 3B is a view illustrating a configuration example of the pre-buffer 30N-i. The pre-buffer 30N-i includes an inverter 72, a logical sum operation circuit (OR circuit) 73, P-type transistors PT13, PT14, and N-type transistors NT13, NT14. A circuit made up of the inverter 72 and the OR circuit 73 corresponds to the ON/OFF control part 31N, and a circuit made up of the P-type transistors PT13, PT14 and the N-type transistors NT13, NT14 corresponds to the gate driving part 32N.

The impedance code NMIC[i] reversed by the inverter 72 and the input signal IN are input to the OR circuit 73, and the OR circuit 73 performs the logical sum operation thereof and outputs an operation result. In each of the P-type transistor PT13 and the N-type transistor NT13, a gate is connected to an output terminal of the OR circuit 73, a drain is connected to a signal line of the drive signal NDRV[i]. A source of the P-type transistor PT13 is connected to the power supply line of the voltage VDDH via the P-type transistor PT14 in which the bias voltage BIASP is supplied to a gate thereof. A source of the N-type transistor NT13 is connected to the power supply line of the voltage VSS via the N-type transistor NT14 in which the bias voltage BIASN is supplied to a gate thereof.

In the pre-buffer 30N-i, the P-type transistor PT13 is in ON state and the N-type transistor NT13 is in OFF state when the impedance code NMIC[i] is "1" and the input signal IN is "0" (zero). Accordingly, the drive signal NDRV[i] is set at the voltage VDDH, and the corresponding N-type transistor Ni of the NMOS output stage 20N is in ON state. Besides, the P-type transistor PT13 is in OFF state and the N-type transistor NT13 is in ON state when the impedance code NMIC[i] is "1" and the input signal IN is "1". Accordingly, the drive signal NDRV[i] is set at the voltage VSS, and the corresponding N-type transistor Ni of the NMOS output stage 20N is in OFF state. When the input signal IN changes from "1" to "0" (zero) or from "0" (zero) to "1" under the state in which the impedance code NMIC[i] is "1", driving ability of an inverter made up of the P-type transistor PT13 and the N-type transistor NT13 is controlled by the P-type transistor PT14 and the N-type transistor NT14 in which the bias voltages BIASP, BIASN are supplied to gates thereof. The slew rate is controlled by controlling a current amount charging and discharging the signal line of the drive signal NDRV[i] as stated above.

Besides, when the impedance code NMIC[i] is "0" (zero), the P-type transistor PT13 is in OFF state and the N-type transistor NT13 is in ON state regardless of the input signal IN. Accordingly, the drive signal NDRV[i] is set at the voltage VSS, and the corresponding N-type transistor Ni of the NMOS output stage 20N is constantly in OFF state.

Next, the slew rate control part 40 is described. The slew rate control part 40 includes an input current circuit 41, a bias voltage generation part 42, and a correction code generation part 43. The slew rate control part 40 generates the bias voltages BIASP, BIASN in accordance with the slew rate control signal SRCTL, and supplies them to the pre-buffers 30P, 30N. The input current circuit 41 generates an input current in accordance with an impedance code for PMOS (current correction code) corrected by the correction code generation part 43 by using the impedance codes PMIC, NMIC, and supplies a gate voltage CMI for the N-channel type transistor in accordance with the input current to the bias voltage generation part 42. Note that the correction of the impedance code by the correction code generation part 43 is not to correct largely but to perform fine adjustment, and the impedance code PMIC for PMOS before correction and the impedance code for PMOS after correction (current correction code) are not largely different. The bias voltage generation part 42 amplifies the input current at a ratio in accordance with the slew rate control signal SRCTL, and performs the current-voltage conversion to generate the bias voltages BIASP, BIASN.

FIG. 4 is a view illustrating an internal configuration example of the slew rate control part 40.

The input current circuit 41 includes inverters 81-i, P-type transistors PT21-i, a fixed resistor RESC, and an N-type transistor NT21. In each of the P-type transistors 21-i, a source is connected to the power supply line of the voltage VDDH, and a drain is connected to one end of the fixed resistor RESC. The impedance code for PMOS corrected by the correction code generation part 43 (current correction code) is input to gates of the P-type transistors PT21-i via the inverters 81-i. In the N-type transistor NT21, a source is connected to the power supply line of the voltage VSS, and a drain is connected to the other end of the fixed resistor RESC. A gate and the drain of the N-type transistor NT21 are connected. A current i0 flowing at the input current circuit 41 corresponds to the input current.

Here, a circuit 82 made up of the P-type transistors PT21-1 to PT21-n has a similar configuration as the above-stated PMOS output stage 20P. Manufacturing variability of the P-type transistors PT21-1 to PT21-n are similarly corrected by using the impedance code to correct the manufacturing variability of the P-type transistors P1 to Pn of the PMOS output stage 20P, and a desired resistance can be obtained. As a result, variation of the input current i0 caused by the manufacturing variability is suppressed, and the variations of the bias voltages BIASP, BIASN are suppressed. Accordingly, it is possible to suppress the variation of the output slew rate caused by the manufacturing variability.

Note that in the circuit 82, it is not necessary to flow the similar current as the PMOS output stage 20P, and therefore, it is not necessary that the P-type transistors PT21-1 to PT21-n of the circuit 82 and the P-type transistors P1 to Pn of the PMOS output stage 20P have the same sizes. It is required that a ratio between a resistance by the P-type transistors PT21-i of the circuit 82 and the fixed resistor RESC is the same as a ratio between a resistance by the P-type transistors P1 to Pn of the PMOS output stage 20P and the resistor ROP when the ON/OFF control in accordance with the impedance code is performed. For example, when the resistance by the P-type transistors P1 to Pn of the PMOS output stage 20P is 100Ω, and a resistance of the resistor ROP is 100Ω, it is required to constitute such that the resistance by the P-type transistors PT21-i of the circuit 82 is 1 kΩ, and a resistance of the fixed resistor RESC is 1 kΩ. As stated above, it becomes possible to make a consumption current small by making a gate length (L) of the transistor large or making a gate width (W) small without changing the ratio between the resistance by the P-type transistors PT 21-i of the circuit 82 and the fixed resistor RESC. Besides, a combined resistance by the P-type transistors PT21-i of the circuit 82 and the fixed resistor RESC is made enough large compared to a resistance by the N-type transistor NT21, and thereby, it becomes possible to make an effect resulting from the manufacturing variability of the N-type transistor NT21 small.

The bias voltage generation part 42 includes P-type transistors PT22 to PT26, and N-type transistors NT22 to NT26. The N-type transistor NT22 is current-mirror connected to the N-type transistor NT21 of the input current circuit 41. A drain of the N-type transistor NT22 is connected to a gate and a drain of the P-type transistor PT22. A source of the P-type transistor PT22 is connected to the power supply line of the voltage VDDH.

The N-type transistors NT23 to NT25 are selectively current-mirror connected to the N-type transistor NT21 via switches controlled by the slew rate control signal SRCTL. A drain of each of the N-type transistors NT23 to NT25 is connected to a gate and a drain of the P-type transistor PT26.

A source of the P-type transistor PT26 is connected to the power supply line of the voltage VDDH. Accordingly, the switches are controlled by the slew rate control signal SRCTL and a current-mirror ratio is controlled, and thereby, a voltage in accordance with a current i2 amplified with the current-mirror ratio is output as the bias voltage BIASP.

The P-type transistors PT23 to PT25 are selectively current-mirror connected to the P-type transistor PT22 via switches controlled by the slew rate control signal SRCTL and a node NODEA. A drain of each of the P-type transistors PT23 to PT25 is connected to a gate and a drain of the N-type transistor NT26. A source of the N-type transistor NT26 is connected to the power supply line of the voltage VSS. Accordingly, the switches are controlled by the slew rate control signal SRCTL and the current-mirror ratio is controlled, and thereby, a voltage in accordance with a current i3 amplified with the current-mirror ratio is output as the bias voltage BIASN.

Figure 5:
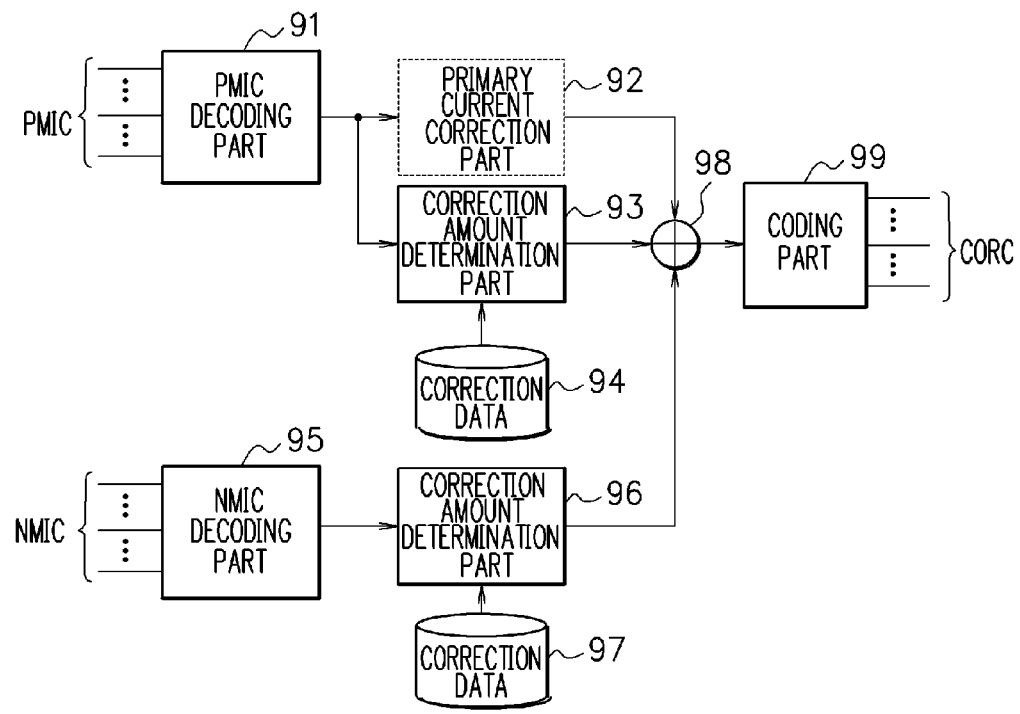
FIG. 5 is a view illustrating a configuration example of a correction code generation part in the present embodiment.

The impedance codes PMIC, NMIC are input to the correction code generation part 43. The correction code generation part 43 determines a correction amount in accordance with threshold value variations of the P-type transistors and the N-type transistors, based on the input impedance codes PMIC, NMIC, and corrects the impedance code PMIC for PMOS. The correction code generation part 43 outputs the corrected impedance code for PMOS (current correction code) to the input current circuit 41. The correction code generation part 43 includes a PMIC decoding part 91, a primary current correction part 92, a correction amount determination part 93, an NMIC decoding part 95, a correction amount determination part 96, an addition processing part 98, and a coding part 99 as illustrated in FIG. 5.

The PMIC decoding part 91 decodes and digitizes the input impedance code PMIC for PMOS. The primary current correction part 92 performs a correction process for the impedance code PMIC digitized by the PMIC decoding part 91 according to need, and outputs to the addition processing part 98. Note that when the correction process is not necessary, the impedance code PMIC digitized by the PMIC decoding part 91 may be output to the addition processing part 98 as it is without providing the primary current correction part 92.

Figure 6:
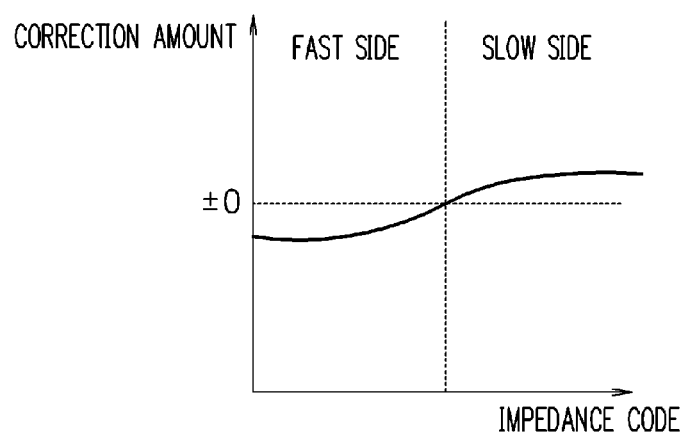
FIG. 6 is a view illustrating an example of correction data.
Figure 9:
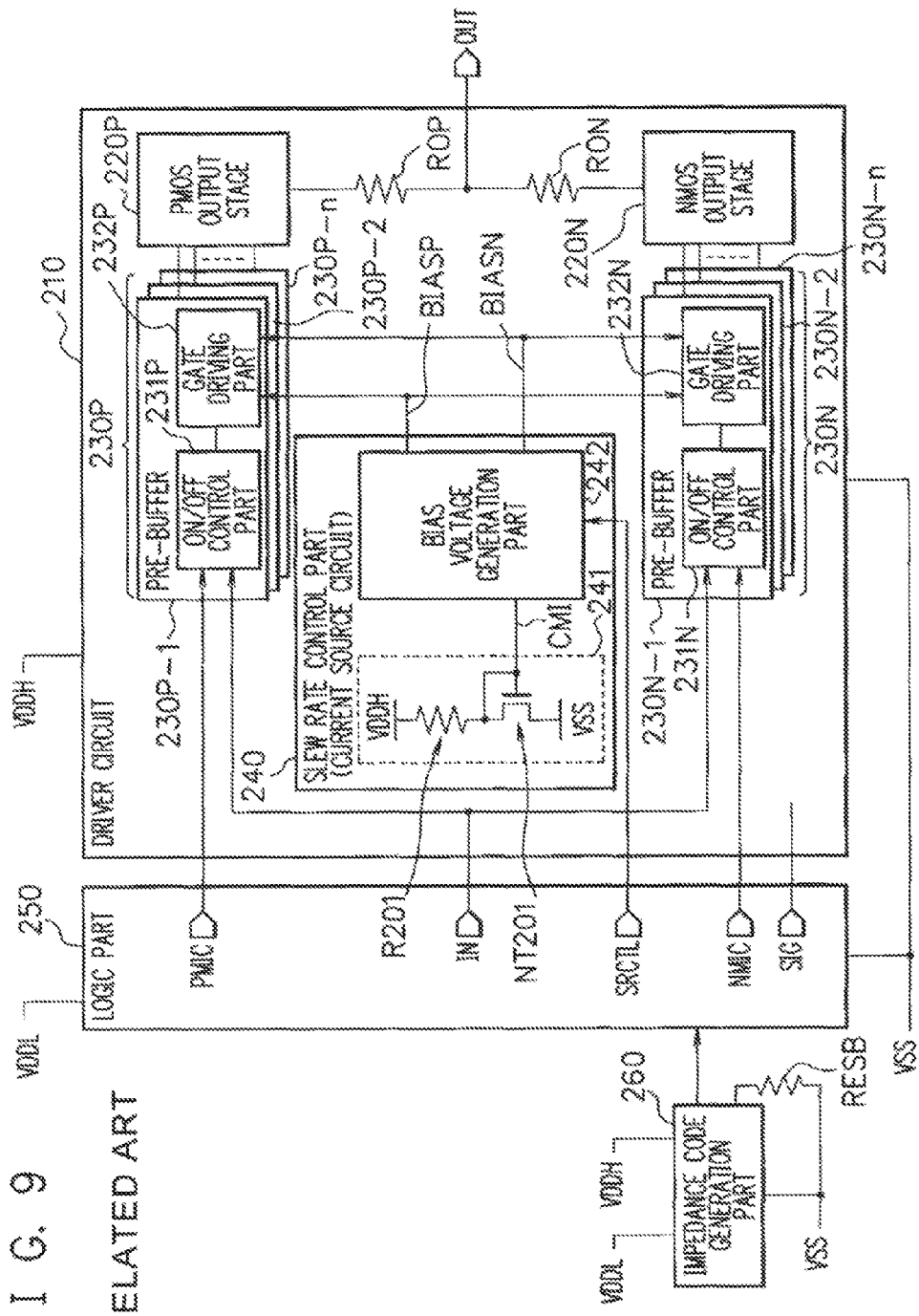
FIG. 9 is a view illustrating a configuration of a conventional driver circuit.

The correction amount determination part 93 refers to a correction date 94 of which example is represented in FIG. 6, and determines the correction amount in accordance with the impedance code PMIC digitized by the PMIC decoding part 91. The correction amount determination part 93 outputs a negative correction amount to reduce the current when it is judged that the variation of the P-type transistor approximates to a Fast side because the digitized impedance code PMIC is small. On the other hand, the correction amount determination part 93 outputs a positive correction amount to increase the current when it is judged that the variation of the P-type transistor approximates to a Slow side because the digitized impedance code PMIC is large. For example, the correction amount is output to decrease for one or two when the digitized impedance code PMIC is small, and to increase for one or two when it is large.

The NMIC decoding part 95 decodes and digitizes the input impedance code NMIC for NMOS. The correction amount determination part 96 refers to a correction data 97 of which example is represented in FIG. 6 as same as the correction amount determination part 93, and determines and outputs a correction amount in accordance with the impedance code NMIC digitized by the NMIC decoding part 95.

The addition processing part 98 adds the value after the correction output by the primary current correction part 92 (or the impedance code PMIC digitized by the PMIC decoding part 91) and the correction amounts output from the correction amount determination parts 93, 96. The coding part 99 encodes the operation results at the addition processing part 98, and outputs as a corrected impedance code CORC for PMOS. Note that the correction data 94, 97 are to be obtained in advance by executing simulations and so on, and to be stored and prepared at a storage part such as a ROM to be able to be referred to.

The correction code generation part 43 corrects the impedance code in accordance with the threshold value variation of the transistors as stated above, and thereby, it is possible to suppress the effect caused by the manufacturing variability of the gate driving parts 32P, 32N, and to suppress the variation of the output slew rate.

(Second Embodiment)

Next, a second embodiment is described.

FIG. 7 is a view illustrating a configuration example of a semiconductor device according to the second embodiment. Note that the input current circuit 41 and the correction code generation part 43 are illustrated in FIG. 7, but the other configurations are similar to the first embodiment. In the second embodiment, a stability control signal CTL to select whether or not a stability control of the input current by using the impedance code is performed at the slew rate control part 40 is supplied to the driver circuit 10 from the logic part 50 in addition to the signals described in the first embodiment. Note that in FIG. 7, elements having the same functions as the elements illustrated in FIG. 4 are designated by the same reference numerals, and thereby duplicating explanations are not given.

The input current circuit 41 according to the second embodiment includes an inverter 101, OR circuits 102-i, a fixed resistor RESD, and an N-type transistor NT31 in addition to the inverters 81-i, the P-type transistors PT21-i, the fixed resistor RESC, and the N-type transistor NT21. Here, the stability control signal CTL is a signal set at high-level when the stability control by using the impedance code is performed, and set at low-level when the stability control is not performed.

The stability control signal CTL reversed by the inverter 101 and an output of the inverter 81-i are input to the OR circuit 102-i, and the OR circuit 102-i outputs an operation result thereof to the gate of the P-type transistor PT21-i. In the fixed resistor RESD, one end is connected to the power supply line of the voltage VDDH, and the other end is connected to the drain of the N-type transistor NT21 via the N-type transistor NT31 as a switching transistor. The stability control signal CTL reversed by the inverter 101 is input to a gate of the N-type transistor NT31. Note that the N-type transistor NT31 is functioned as the switch, and therefore, a resistance thereof is made enough small relative to the fixed resistor RESD by making a gate width large or connecting the plural transistors in parallel, and so on.

An output of the inverter 81-i is input to a gate of the P-type transistor PT21-i when the stability control signal CTL is in high-level, namely, the stability control by using the impedance code is performed in the input current circuit 41 illustrated in FIG. 7. Besides, the N-type transistor NT31 is in OFF state. Accordingly, when the stability control signal CTL is in high-level, the input current circuit 41 operates similar to the first embodiment, and the variations of the bias voltages BIASP, BIASN caused by the manufacturing variability are suppressed, and the variation of the output slew rate is suppressed. On the other hand, all of the P-type transistors PT21-i are in OFF states regardless of the output of the inverter 81-i when the stability control signal CTL is in low-level, namely, the stability control by using the impedance code is not performed. Besides, the N-type transistor NT31 is in ON state. The input current is thereby generated by a current source circuit made up of the fixed resistor RESD and the N-type transistor NT21. As stated above, in the second embodiment, it is possible to switch whether or not the stability control by using the impedance code is performed in accordance with the stability control signal CTL.

(Third Embodiment)

Next, a third embodiment is described.

FIG. 8 is a view illustrating a configuration example of a semiconductor device according to the third embodiment. Note that in FIG. 8, only the logic circuit 50 is illustrated, and further, only a configuration relating to output of the impedance code for PMOS and the stability control signal CTL is illustrated. The other configurations are similar to the above-stated embodiments.

In the third embodiment, it is enabled to control whether or not the stability control by using the impedance code is performed and to control an update timing and a value of the impedance code supplied to the slew rate control part 40 of the driver circuit 10. In FIG. 8, a selector 111 selects and outputs the impedance code supplied to the slew rate control part 40 in accordance with a value supplied from a register 112. The selector 111 outputs the impedance code PMIC in itself as an impedance code PMICA supplied to the slew rate control part 40 when the value supplied from the register 112 is "00". The selector 111 outputs the impedance code PMIC held at a latch 113 as the impedance code PMICA at a certain timing when the value supplied from the register 112 is "01". The selector 111 outputs a fixed value (typical value) 114 as the impedance code PMICA when the value supplied from the register 112 is "10". The selector 111 outputs a value set at a register 115 as the impedance code PMICA when the value supplied from the register 112 is "11".

A selector 116 outputs the stability control signal CTL generated at the logic part 50 as a stability control signal CTLA supplied to the slew rate control part 40 when a value supplied from a register 117 is "0" (zero). The selector 116 outputs a signal fixed to "0" (zero) as the stability control signal CTLA supplied to the slew rate control part 40 when the value supplied from the register 117 is "1". Namely, when the value supplied from the register 117 is "0" (zero), execution of the stability control is controlled in accordance with the stability control signal CTL, and when the value supplied from the register 117 is "1", it is constantly controlled not to execute the stability control.

Note that settings of the values to the registers 112, 115, 117 may be performed at, for example, a power on time (power application time), or may be made to be rewritable during operation by means of firmware and so on.

According to the third embodiment, it is possible to control whether or not the stability control by using the impedance code is performed. Besides, it is possible to control whether or not the update of the impedance code is simultaneously performed at the PMOS output stage 20P, the NMOS output stage 20N, and the slew rate control part 40. Besides, a control of an optimum setting and so on of the impedance code supplied to the slew rate control part 40 by the register 115 becomes possible.

In the disclosed driver circuit, variation of the input current caused by the manufacturing variability of the circuit element at the current-source circuit is suppressed, the driving ability of the gate control part is able to be appropriately controlled, and the variation of the output slew rate can be suppressed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A driver circuit, comprising:
a first output part in which plural first conductive transistors are connected in parallel, and an output impedance is controlled in accordance with first control information;
a second output part in which plural second conductive transistors are connected in parallel, and an output impedance is controlled in accordance with second control information;
a gate control part which drives the plural first conductive transistors held by the first output part and the plural second conductive transistors held by the second output part; and
a current source circuit which generates a signal controlling driving ability of the gate control part,
wherein the current source circuit includes:
plural first conductive transistors corresponding to the plural first conductive transistors held by the first output part and ON/OFF controlled based on the first control information;
a first resistor in which drains of the plural first conductive transistors are commonly connected to one end thereof; and
a signal generation part which receives a current flowing at the plural first conductive transistors and the first resistor as an input current, and generates a signal controlling the driving ability of the gate control part based on the input current.

2. The driver circuit according to claim 1,
wherein the current source circuit further includes:
a correction information generation part which corrects the first control information based on the first control information and the second control information,
wherein the plural first conductive transistors held by the current source circuit are ON/OFF controlled based on the first control information corrected by the correction information generation part.

3. The driver circuit according to claim 2,
wherein the correction information generation part corrects to make a value indicated by the first control information small when a value indicated by the control information is smaller than a certain value, and corrects to make the value indicated by the first control information large when the value indicated by the control information is larger than the certain value.

4. The driver circuit according to claim 1,
wherein the first output part is connected to an output terminal of the driver circuit via a second resistor, and
a ratio between a resistance by the plural first conductive transistors held by the current source circuit and the first resistor when the plural first conductive transistors held by the current source circuit are ON/OFF controlled in accordance with the first control information is equal to a ratio between a resistance by the plural first conductive transistors held by the first output part and the second resistor when the plural first conductive transistors held by the first output part are ON/OFF controlled in accordance with the first control information.

5. The driver circuit according to claim 1,
wherein the gate control part includes:
a logical circuit which performs a logical operation between the first control information and the second control information, and an input signal to the driver circuit; and
an inverter of which driving ability is controlled by a signal generated by the current source circuit, and which reverses an output of the logical circuit and outputs to the first output part and the second output part.

6. The driver circuit according to claim 1,
wherein the current source circuit includes a constant-current source circuit, and
wherein it is switchable whether a current flowing at the plural first conductive transistors and the first resistor is received by the signal generation part as the input current, or a current generated by the constant-current source circuit is received by the signal generation part as the input current.

7. The driver circuit according to claim 1,
wherein the signal generation part generates a bias voltage controlling the driving ability of the gate control part in accordance with the input current and supplies the bias voltage to the gate control part.

8. A semiconductor device, comprising:
a driver circuit; and
a logic part which outputs a first control information, a second control information, an input signal, and a setting signal of driving ability of the gate control part to the driver circuit,
wherein the driver circuit includes:
a first output part in which plural first conductive transistors are connected in parallel, and an output impedance is controlled in accordance with the first control information;
a second output part in which plural second conductive transistors are connected in parallel, and an output impedance is controlled in accordance with the second control information;
a gate control part which drives the plural first conductive transistors held by the first output part and the plural second conductive transistors held by the second output part; and
a current source circuit which generates a signal controlling driving ability of the gate control part,
wherein the current source circuit includes:
plural first conductive transistors corresponding to the plural first conductive transistors held by the first output part and ON/OFF controlled based on the first control information;
a first resistor in which drains of the plural first conductive transistors are commonly connected to one end thereof; and
a signal generation part which receives a current flowing at the plural first conductive transistors and the first resistor as an input current, and generates a signal controlling the driving ability of the gate control part based on the input current.

* * * * *